United States Patent [19]
Petroz

[11] Patent Number: 5,225,634
[45] Date of Patent: Jul. 6, 1993

[54] HYBRID CIRCUIT FORMED OF TWO CIRCUITS WHOSE TRACKS ARE CONNECTED BY ELECTRIC CONNECTION BALLS

[75] Inventor: Gérard Petroz, Montbonnot, France

[73] Assignee: Commissariat a l'Energie Atomique, France

[21] Appl. No.: 782,539

[22] Filed: Oct. 25, 1991

[30] Foreign Application Priority Data

Nov. 16, 1990 [FR] France ................... 90 14311

[51] Int. Cl.[5] .............................................. H01R 4/02
[52] U.S. Cl. ................................ 174/88 R; 174/84 R; 174/250; 174/260; 174/261
[58] Field of Search ................... 174/84 R, 88 R, 250, 174/254, 260, 261

[56] References Cited

U.S. PATENT DOCUMENTS

| | | | |
|---|---|---|---|
| 3,811,186 | 5/1974 | Larnerd et al. | 174/26 X |
| 4,783,722 | 11/1988 | Osaki et al. | 361/411 |
| 5,011,066 | 4/1991 | Thompson | 174/261 X |
| 5,121,299 | 6/1992 | Frankeny et al. | 174/261 X |

FOREIGN PATENT DOCUMENTS 0355965 2/1990 European Pat. Off. .
2464010 8/1980 France .

OTHER PUBLICATIONS

"VLSI Chip Interconnection Technology Using Stacked Solder Bumps" Proceedings of the 37th Electronic Components Conference May 11-13 1987, pp. 573-578 IEEE, New York, U.S.; N. Matsui et al.

*Primary Examiner*—Morris H. Nimmo
*Attorney, Agent, or Firm*—Hayes, Soloway, Hennessey & Hage

[57] ABSTRACT

Hybrid circuit formed of two circuits (1, 2) combined by spherical balls (10) with electric connection.

The conductive tracks (6) the balls (10) connect do not adhere to the circuits (1, 2) at portions (11) situated around the balls (10). As a result, these portions (11) may be safely removed and the balls (10) are able to roll onto the circuits (1, 2) if the latter are subjected to a relative movement due, for example, to differential thermic cubical expansions. Thus, the balls (10) are not stressed.

5 Claims, 2 Drawing Sheets

HYBRID CIRCUIT FORMED OF TWO CIRCUITS WHOSE TRACKS ARE CONNECTED BY ELECTRIC CONNECTION BALLS

FIELD OF THE INVENTION

The invention concerns a hybrid circuit formed of two electronic circuits each comprising tracks on one connection face, the tracks of the two electronic circuits being connected by electric connection balls.

BACKGROUND OF THE INVENTION

Connection by balls made of materials having a low melting point is widely used to connect two electronic circuits and thus forming a composite or hybrid circuit. There are balls intended for a purely mechanical connection of circuits and other balls which connect the conductive tracks of the two circuits and above all providing an electric connection. However, generally speaking, the balls simultaneously provide both the mechanical and electrical connection functions, as described in the patent application WO 7/01509.

A certain number of hybrid circuits are subjected to significant thermic amplitudes during the time they are functioning. When the materials of the substrate of the two electronic circuits have different coefficients of expansion, the balls are subjected to shearing stresses which end up by breaking them directly or by virtue of a fatigue phenomenon. The stresses are normally greater at the periphery of the two electronic circuits as the displacements due to the expansions are more marked. When a ball is broken, it may obviously no longer connect the two electronic circuits, the functioning of the latter being compromised if an electric connection ball is used.

A widely used technique to prolong the life of the hybrid circuit consists of acting on the shape of the connection balls. When the material intended to constitute a ball is melted so as to moisten the electronic circuits and form a weld once it has resolidified, it takes a shape which depends on its volume, the spacing of the electronic circuits and the wettable surfaces of the two circuits to which this material adheres and on which it is spread in a liquid state. Thus, it is possible to correct the action of the surface tension forces which would provide spherical balls so as to obtain small column-shaped balls which are more or less slender, bulging or, on the other hand, narrowed at the center, as described in the patent application JP-A-62 15 0837 (Patents abstracts of Japan, vol. 11, No 384).

The small column-shaped slender or slightly bulging balls, that is not having a spherical shape, are in fact only subjected to concentrations of moderate stresses. Thus, the problems of fatigue are reduced but without completely eliminating them.

Another problem described in the article by Norio Matsui and published in IEEE Transactions on Components, hybrids and Manufacturing Technology (vol. CHMT 12, No 4, December 1987 p.566-570) consists of vertically juxtaposing the balls so as to obtain columns in which the stresses would be reduced. In this case, the result obtained being equivalent to the previous one, is not satisfactory and requires the use of extremely heavy equipment and involves a large number of delicate operations.

SUMMARY OF THE INVENTION

However, the present invention resorts to using electric connection balls which are as round as possible, indeed almost spherical. These balls connect the tracks of electronic circuits having portions at the location of and around connection zones and which do not adhere to the electronic circuits.

Such non-adherent zones on a substrate are used in the European patent 0 335 965 so as to relieve the stresses produced by the differential cubic expansions on the connection elements, but which in this case are cylindrical or flattened and rigidly connected to the component which they join to the substrate. Thus, there is no possibility of rolling by combining the ball and the two non-adherent zones, this rolling possibility being the best way to relieve the stresses, especially when the tracks are subjected to shearing produced by differential cubic expansions perpendicular to them.

These free portions preferably have a length equal at least to the radius of the balls. The hybrid circuit may include additional balls corresponding to those of the prior art and simultaneously ensuring the mechanical behaviour and electric connection between the electric circuits grouped together in one central region of the hybrid circuit ; in fact, in the central region of the hybrid circuit, the differential cubic expansions between the two electronic circuits forming the hybrid circuit are weak and in effect negligible. The electric connection balls of the invention are located in a peripheral region, the portions of the tracks not adhering to the circuits preferably being perpendicular to the respective directions which lead to the central region.

BRIEF DESCRIPTION OF THE DRAWINGS

There now follows a more detailed description of the invention with the aid of the following figures given by way of illustration and being non-restrictive.

DETAILED DESCRIPTION OF THE PREFERRED EMBODIMENTS

Figure 1:
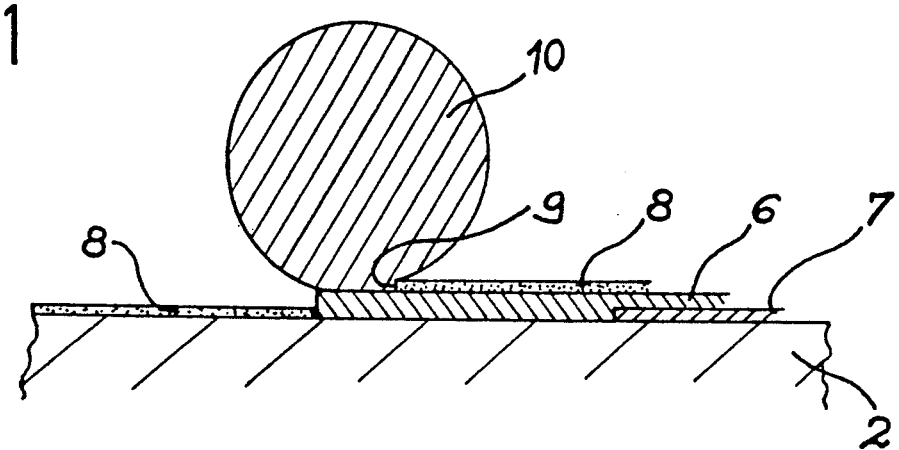
FIGS. 1, 2 and 3 show one ball conforming to the invention and show top, side and front views of the adjacent portions of the electronic circuits.
Figure 2:
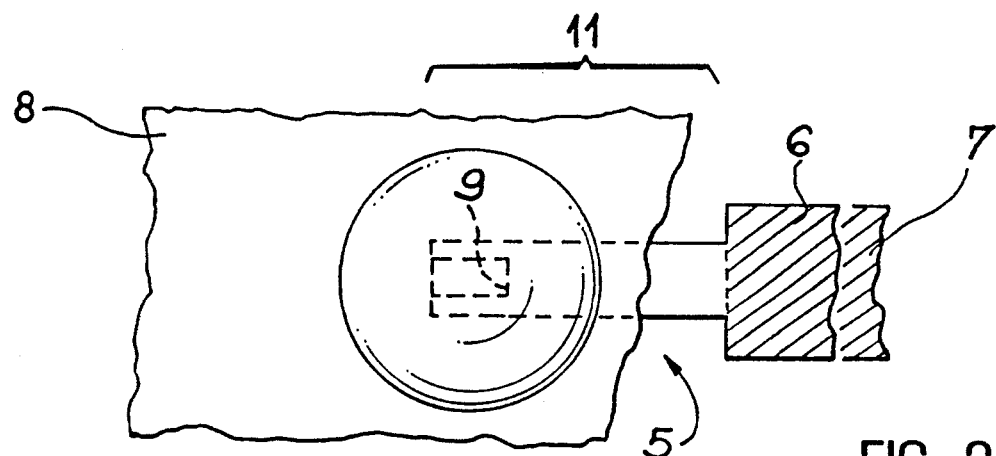
Figure 3:
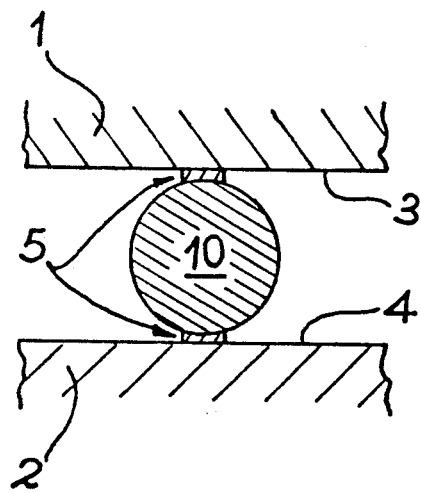

Reference is first made to FIGS. 1 to 3. The electronic circuits 1 and 2 mainly comprise a substrate, possibly made of silicon for one circuit, and of aluminium or II-VI or III-V compounds for the other, this substrate having one connection face, respectively 3 and 4. The connection faces 3 and 4 are parallel and bear tracks 5 for the transmission of electric signals. Each track 5 is mainly formed of a strip 6 made of an electric conductive material, such as gold, deposited thinly on the connection face 3 or 4. However, as gold does not adhere to normal substrates, a sub-film 7 is deposited on the connection face 3 or 4 before depositing the film whose etching then provides the conductive strips 6. It is made of either chromium or titanium which adheres both to the materials of the substrate and those of the conductive strips 6 which are thus glued to the connection face 3 or 4.

A passivation film 8 is generally deposited on the conductive strips 6 so as to protect them. This film may be made of silicon dioxide or zinc sulfide and have openings on portions of the conductive films 6 forming the connection zones 9. Electric connection balls 10 extend between the connection zones 9 of two tracks 5 disposed respectively on the connection faces 3 and 4. The balls 10 are made of a metal or alloy with a low melting point, such as indium, indium-tin or tin-lead.

The conductive strips 6, the sub-film 7 and the passivation film 8 are formed on the connection faces 3 or 4 via the normal techniques used in this field for depositing uniform films and etching these films by means of suitable masks, this process not requiring any particular comments. The material for constituting the balls 10 is then deposited on the connection zones 9.

The electronic circuit 2 is then heated in a deoxidant medium until the material required to constitute the balls 10 melts and is recovered under the effect of surface tension forces. This material is selected so as to moisten the material of the conductive strips 6 but not that of the passivation film 8. The balls 10 obtained after cooling and solidification finally have a spherical shape truncated at the connection zones 9 where the material of the balls 10 is spread onto the uninsulated portions of the conductive strips 6.

The second electronic circuit 1 is then laid on the balls 10 which are subjected to a new melting without allowing the circuits 1 and 2 to approach each other. Current hybridation machines make it possible to accurately adjust the spacing of the connection faces 3 and 4. The material of the balls 10 is spread onto the connection zones 9 from the other connection face 3 without really changing the shape of the balls 10 and the connection between the electronic circuits 1 and 2 is established as soon as the balls 10 have resolidified.

The connection zones 9 are preferably small so as to obtain balls which are as spherical as possible : the width of the tracks 5 is preferably small with respect to the diameter of the balls 10 (4 and 20 microns respectively, for example).

According to the invention, the adherence sub-film 7 is not present under the free portions 11 of the tracks 5 extending below the balls 10 and more particularly includes the connection zones 9 and those zones situated on both sides of the connection zone 9. The free portions 11 thus do not adhere to the connection faces 3 and 4.

Figure 4:
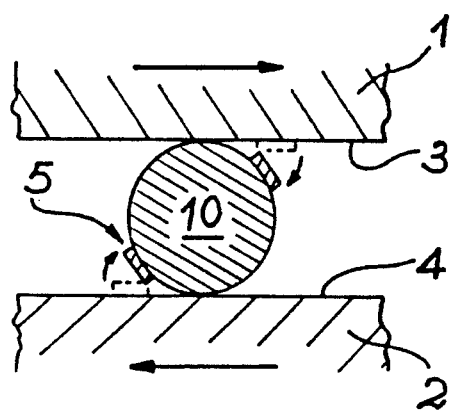
FIG. 4 shows the functioning of the invention.

When the hybrid circuit formed from the two electronic circuits 1 and 2 is subjected to significant heating or cooling, the differences of any cubic expansions which might occur are expressed via a mutual sliding movement of the two electronic circuits 1 and 2 parallel to their planes. FIG. 4 shows the result obtained : the balls 10 roll onto the two connection faces 3 and 4 without hardly being subjected to the forces, and the free portions 11 are separated and subjected to torsion deformations. However, in practice, the resultant stresses are slight with respect to the stresses the ball 10 needs to withstand if the latter were rigidly connected to the circuits 1 and 2 as the conductive films 6 are relatively thin and the rolling of the balls 10 is a movement which relatively moves the free portions 11 slightly, at least for moderate angles of rotation. Thus, it is sought to place the free portions 11 perpendicular to the differential thermic expansions in the hybrid circuit.

It is preferable that the free portions 11 be narrower that the rest of the tracks 5, as shown on FIG. 2, so as to limit the torsion stresses. The portion of the passivation film 8 found above the free portions 11 is pulled up on the first movement of the balls 10 and follows the conductive strips 6.

Figure 5:
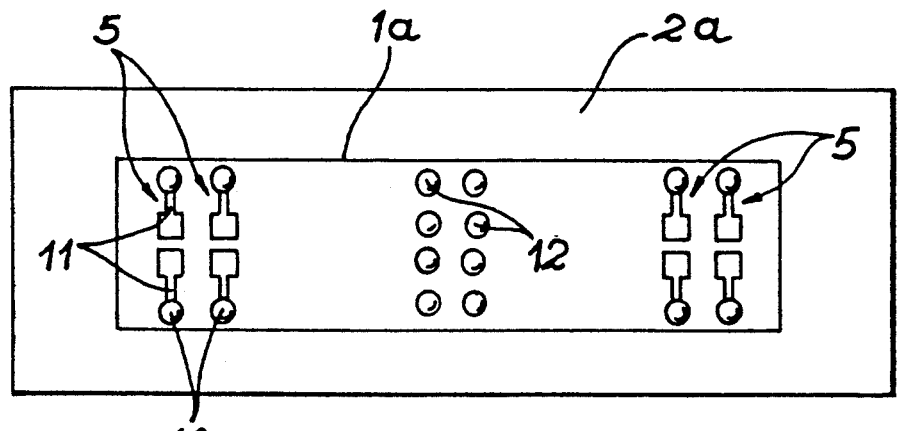
FIGS. 5 and 6 show two types of hybrid circuits.

The flexibility of the linkage is much greater for movements of the balls 10 perpendicular to the free portions. Two types of hybrid circuits conceived to correspond to this observation are shown on FIGS. 5 and 6. In FIG. 5, the circuits 1a and 2a are elongated small bars. The tracks 5 and the free portions 11 extend according to the transversal size of the small bars 1a and 1b. The electric connection balls 10 are distributed along a longitudinal row. The mechanical connection between the circuits 1a and 1b is ensured by several transversal rows of mechanical connection balls 12 conforming to the prior art at the center of the small bars 1a and 1b. If thermic expansions occur, these are mainly longitudinal.

Figure 6:
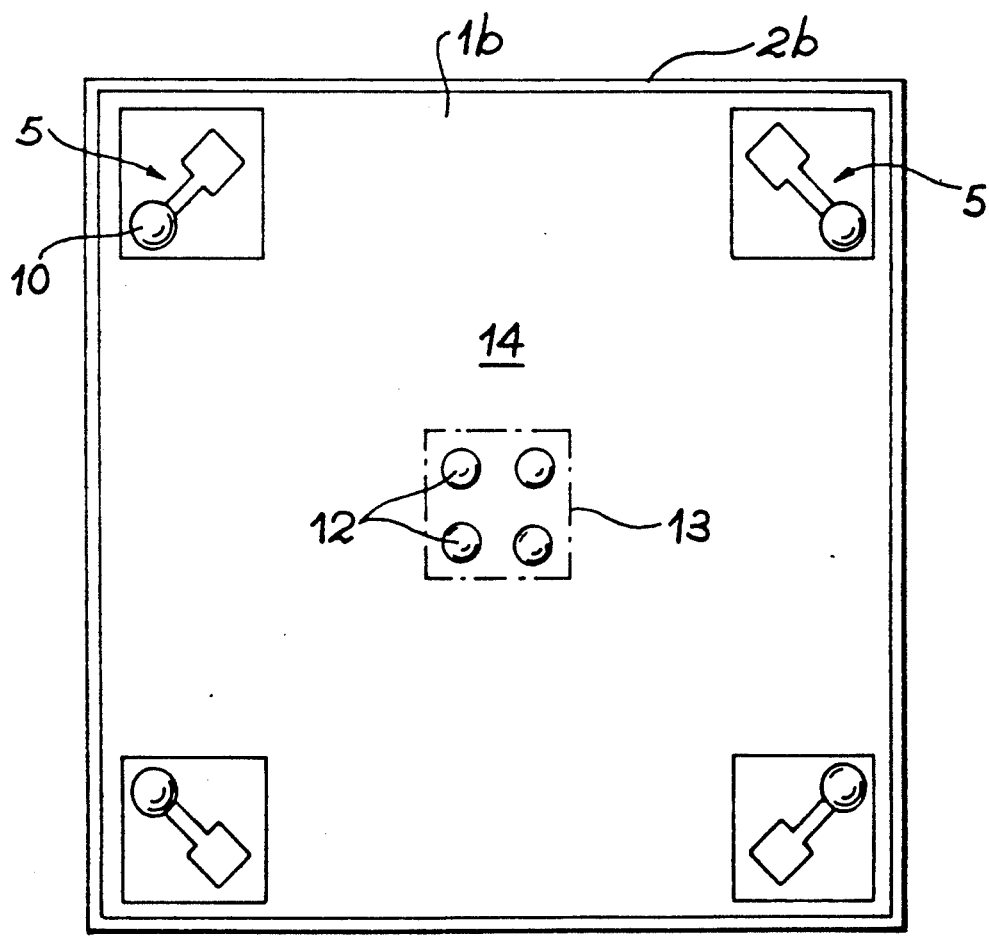

The electronic circuits 1b and 2b of FIG. 6 have a square shape and are interconnected by balls 12 concentrated in a central region 13. The stresses applied to these balls are negligible and shall also conform to the prior art. The remainder of the circuits 1b and 2b form a peripheral region 14 surrounding the preceding one, the tracks 5 on this region bearing the portions 11 and the electric connection balls 10 being orientated so as to be perpendicular to directions bringing the respective balls 10 to the central region 13. In fact, if thermic expansions do occur, they shall mainly be radial and crossing from the central region 13.

The invention may be implemented in other ways, especially with different materials. All the materials normally used in this technique and which have the characteristics listed above for embodiment of the invention may be suitable. The balls 10 may have a diameter of several tens of micrometers, the sub-film 7 and the passivation film 8 thicknesses of several hundreds of nanometers and the free portions 11 having widths of several micrometers. It needs to be mentioned that the balls 10 may be made of materials excluded in design conceptions where they are subjected to shearing stresses, especially hard materials which roll easily and without being flattened under the weight of the upper electronic circuit 1 or 2 but when their slight ductility renders them unsuitable to withstand significant deformations. This is thus the case when the foot of the balls 10 is the center of a local diffusion of the metal of the conductive strips 6. In the case of gold and indium, the alloy which is formed is harder than indium and thus less clearly resists deformations, this being disadvantageous in the conceptions of the prior art as it is located precisely at the place where the shearing stresses are the greatest. In the invention, the alloy increases hardness of the location subjected to rolling and thus improves this rolling.

What is claimed is:

1. A hybrid circuit comprising:
   a. two electronic circuit boards, each said board having a connection surface, said connection surfaces being oriented so as to face each other and having conductive tracks including free portions extending from other portions different from said free portions, said free portions not adhering to said connection surfaces and said other portions adhering to said connection surfaces, said free portions being located at ends of said tracks;
   b. means for rigidly mechanically connecting said two boards; and
   c. electrically conductive, spherically-shaped balls for electrically connecting said free portions of said tracks, said balls extending between said two connection surfaces and adhering to said free portions of said tracks, said balls and said free portions being able to rotate when said boards undergo displacement relative to each other caused by differential thermal expansion of said two boards, whereby to permit reduction of shear force applied by said differential thermal expansion of said boards to said balls.

2. A hybrid circuit according to claim 1, wherein said free portions of said tracks are oriented perpendicular to the direction of said thermal expansion of said two boards.

3. A hybrid circuit according to claim 1, wherein said free portions of said tracks have a length at least equal to the radius of said balls.

4. A hybrid circuit according to claim 1, wherein said free portions of said tracks are narrower than said other portions of said tracks.

5. A hybrid circuit according to claim 2, wherein:
i. said mechanical connecting means comprises balls rigidly connecting said two boards at central regions thereof; and
ii. said electrically conducting balls connect said tracks of said two boards adjacent peripheral regions of said two boards, said free portions of said tracks being oriented perpendicular to the respective directions leading to said central regions.

* * * * *